United States Patent [19]

Bube

[11] 4,163,678

[45] Aug. 7, 1979

[54] SOLAR CELL WITH IMPROVED N-REGION CONTACT AND METHOD OF FORMING THE SAME

[76] Inventor: Robert A. Frosch, Administrator of the National Aeronautics and Space Administration, with respect to an invention of Kenneth R. Bube, Skillman, N.J.

[21] Appl. No.: 920,879

[22] Filed: Jun. 30, 1978

[51] Int. Cl.$^2$ ............................................. H01L 31/06
[52] U.S. Cl. ................................. 136/89 CC; 29/572; 29/589; 357/30; 357/65; 357/67; 252/514; 106/1; 106/1.2; 427/88
[58] Field of Search ............. 136/89 CC; 29/572, 589; 357/30, 65, 67; 427/88; 252/514; 106/1

[56] References Cited

U.S. PATENT DOCUMENTS 4,105,471   8/1978   Yerkes et al. .................... 136/89 CC

OTHER PUBLICATIONS

A. D. Haigh "Fired Through Printed Contacts on Antireflection Coated Silicon Terrestrial Solar Cells," *Conf. Record, 12th IEEE Photospecialists Conf.* (1976), pp. 360–361.

*Primary Examiner*—Aaron Weisstuch
*Attorney, Agent, or Firm*—Monte F. Mott; John R. Manning; Wilfred Grifka

[57] ABSTRACT

An improved solar cell, and method of forming the same, characterized by a semiconductor silicon wafer of P-type material having diffused therein a shallow N-type region, a sintered silver contact affixed to the surface of the N-type region at the outer surface thereof formulated from silver powder blended with silver metaphosphate for establishing a zone of increased carrier concentration, and an aluminum or silver-/aluminum alloy contact affixed to the P-type wafer at the outer surface thereof opposite the N-type region.

5 Claims, No Drawings

SOLAR CELL WITH IMPROVED N-REGION CONTACT AND METHOD OF FORMING THE SAME

ORIGIN OF THE INVENTION

The invention described herein was made in the performance of work under a NASA contract and is subject to the provisions of Section 305 of the National Aeronautics & Space Act of 1958, Public Law 85-568 (72 Stat. 435; 42 USC 2457).

BACKGROUND OF THE INVENTION

1. Field of the Invention

The invention generally relates to photovoltaic devices and more particularly to an improved silicon solar cell having a shallow N-type region and a contact characterized by reduced contact resistance.

2. Description of the Prior Art:

As pointed out in United States Letters Pat. No. 4,029,518, in general, a solar cell comprises a semiconductor wafer of one conductivity type having diffused into one surface thereof a thin layer of a conductivity type opposed to that of the semiconductor wafer. Where the thin layer comprises an N-type region, the region is formed by diffusing impurities into the semiconductor wafer to establish an N on P junction between the layer and the wafer. Diffusion often is accomplished by treating a surface of a silicon wafer with $POCl_3$ and thereafter heating to a temperature of approximately 850° C., the duration of the period for heating being determinative of junction depth. As is well known, the opto-electric conversion efficiency of a solar cell is enhanced as its N-type region becomes thinner. Silicon solar cells presently are composed of shallow N-type regions of 0.5 $\mu$m, diffused into P-type silicon.

To provide a low cost method of collecting currents from the N-type region of a single crystal silicon wafer, techniques requiring a use of screen printing and fired metallizing steps frequently are employed. Conventionally, commercially available metallizing inks which contain finely divided glass frit in addition to metal powder and organic vehicles are employed for depositing contacts on the surface of the N-type region. The metal powder frequently includes silver, aluminum, nickel, gold, copper or alloys of these with precious metals including platinum and palladium.

Samples of silver, aluminum and nickel ink fired onto silicon wafers of varying carrier concentrations, crystallographic orientations and dopant types normally can be expected to be found deficient in specific contact resistance and/or metallization penetration. For acceptable solar cell operation, the specific contact resistance must be no higher than $2 \times 10^{-2}$ $\Omega$-cm$^2$ and metallization penetration into the shallow N-type region must be considerably less than 0.5 $\mu$m in order to avoid a shorting of the cell.

As is known, specific contact resistance can be kept below the required value by firing commercial materials, of the type aforementioned, at 700° C. for about ten minutes in order to effect suitable sintering of the screen printed contact. Unfortunately, heating of the cells to such temperatures for such periods tends to cause the metallization penetration to exceed 0.5 $\mu$m.

Since conventional metallizations contain frits which are designed for application to ceramic and glass surfaces, the electrical properties of the frit constituents generally are not considered in formulating frit for the inks. Hence, it is not uncommon to find frits containing both group III and group V dopants. Consequently, the ability of these frits to locally increase carrier concentrations at the surface of the N-type region and to reduce specific contact resistance is severely impaired.

It is, therefore, the general purpose of the instant invention to provide an improved solar cell characterized by a semiconductor wafer of P-type material having a shallow N-type region diffused into the P-type material for establishing a P-N junction between the region and the wafer and an improved contact affixed to the N-type region and which serves to establish a zone of increased carrier concentration.

SUMMARY OF THE INVENTION

It is, therefore, an object of the instant invention to provide an improved solar cell characterized by an improved contact for a shallow N-type region diffused on a P-type material.

It is another object of the invention to provide a method for forming an improved contact on the N-type region of a solar cell for use in collecting an opto-electric current.

These and other objects and advantages are achieved through an improved solar cell, and a method of forming the same, characterized by a semiconductor wafer of P-type material having diffused therein a shallow N-type region having a sintered silver contact affixed to the N-type region, formulated from silver powder blended with silver metaphosphate and characterized by a metallization penetration of less than 0.5 $\mu$m for establishing a zone of increased carrier concentration whereby resistivity is reduced.

DESCRIPTION OF THE PREFERRED EMBODIMENT

In forming the solar cell of the instant invention, a silicon wafer of P-type material is provided with an N-type region diffused into a P-type silicon. Normally, the N-type region includes a group V dopant, such as phosphorous, while the P-type material includes a group III dopant, such as boron, aluminum or the like.

Since N on P solar cells, as well as the techniques for producing such devices are well known, a detailed discussion of the cell and its mode of operation is omitted in the interest of brevity. However, it will be appreciated that in order to provide for collecting current from the cell the N-type region of the cell is provided with an improved sintered silver contact characterized by lower resistivity and reduced metallization penetration.

The contact is formulated from a mixture of silver metaphosphate and silver. For example, silver metaphosphate mixed with relatively coarse silver powder of 0.9–3.4 m$^2$/gr blended to yield 90 to 98 weight percent silver provides a mixture suitable for this purpose.

The mixture of powdered silver and silver metaphosphate is then introduced into a vehicle comprising polymer and a solvent. In practice, a mixture of ethyl cellulose N-300, obtainable from the Hercules Corporation of Wilmington, Delaware, and a solvent obtainable from Union Carbide under the trade name butyl carbitol has been used successfully. The resulting mixture is worked to a paste-like consistency and applied to the surface of the N-type region utilizing known screen printing techniques. Thus, the N contact is formed as a grid on the surface of the N-type region.

The N contact, thus formed, is next dried at a suitable temperature. For example, the contact is heated to 125° C. for fifteen minutes to drive off the solvent leaving a residue of the polymer, silver and silver metaphosphate. In practice, the polymer is decomposed through a continued heating the cell. Again, in practice, it has been found that a heating of the contact to about 500° C. for a period of fifteen seconds assures total removal of the polymer.

It is, of course, well known that silver metaphosphate melts at a temperature of 485° C. Moreover, silver metaphosphate produces a contact angle of approximately 8° when fired on silicon at 500° C. Hence, good wetting of the surface of the N-type region by the phosphorous bearing mixture is possible at approximately the temperatures employed in wetting silicon surfaces using conventional metallizing inks.

The cell is then heated to a suitable temperature for a period sufficient to sinter the silver in order to enhance conductivity, but insufficient to cause excessive metallization penetration. Such a temperature has been found to exist within a range of 500° C. to 700° C. with an exposure time of five minutes. When employing these temperatures the screen printed and fired metallization showed no penetration of the silicon.

Similarly, a contact is applied to the P layer. However, in the formulation of the metallization used for forming the P contact, aluminum and silver/aluminum alloys are employed. Since the manner in which the P contact is formed comprises no part of the invention, as claimed, a detailed description thereof is omitted in the interest of brevity.

In view of the foregoing, it should readily be apparent that a cell fabricated in accordance with the principles of the instant invention provides an improved solar cell adapted to function with increased efficiency in the conversion of solar energy to electricity.

I claim:

1. In a solar cell characterized by a semiconductor wafer of a P-type material having an N-type region including a group V dopant for establishing a P-N junction, an improved contact affixed to the N-type region at an outer surface of the cell comprising a sintered mixture of silver and metaphosphate.

2. The cell of claim 1 wherein said N-type region includes a phosphorous dopant and said P-type material includes a group III dopant.

3. The cell of claim 1 wherein said N region contact includes silver powder of 0.9 to 3.4 $m^2/gr$ blended with silver metaphosphate to yield 95 weight percent silver.

4. A method for forming an improved solar cell comprising a wafer of P-type material and having an N-type region characterized by a depth of 0.5 $\mu$m comprising the steps of:
   A. mixing silver powder of 0.9–3.4 $m^2/gr$ size with silver metaphosphate blended to yield 95 weight percent silver;
   B. forming a silver paste by mixing the blended silver powder and silver metaphosphate with an organic vehicle to a paste consistency;
   C. screen printing a quantity of said silver paste on the surface of the N-type region for forming thereon a contact grid;
   D. heating the contact grid to 500° C. for a period of fifteen seconds for removing the organic vehicle; and
   E. heating the cell to a temperature within a range and for a period sufficient to cause sintering of the silver to occur and insufficient to cause excessive metallization penetration to occur.

5. The method of claim 4 wherein the cell is heated to a temperature within a range of 500° C. and 700° C. for a period within a range of two to ten minutes.

* * * * *